United States Patent [19]

Eklund

[11] Patent Number: 4,835,115
[45] Date of Patent: May 30, 1989

[54] METHOD FOR FORMING OXIDE-CAPPED TRENCH ISOLATION

[75] Inventor: Robert H. Eklund, Plano, Tex.

[73] Assignee: Texas Instruments Incorporated, Dallas, Tex.

[21] Appl. No.: 129,270

[22] Filed: Dec. 7, 1987

[51] Int. Cl.⁴ .......................................... H01L 21/265
[52] U.S. Cl. ......................................... 437/38; 437/67; 437/69
[58] Field of Search .................... 437/67, 78, 38, 69

[56] References Cited

U.S. PATENT DOCUMENTS

| | | | |
|---|---|---|---|
| 4,372,030 | 2/1983 | Saitoh | 437/38 |
| 4,400,715 | 8/1983 | Barbee et al. | 357/49 |
| 4,454,647 | 6/1984 | Joy et al. | 156/648 |
| 4,528,047 | 7/1985 | Beyer et al. | 156/643 |
| 4,534,826 | 8/1985 | Goth et al. | 156/643 |
| 4,541,167 | 9/1985 | Havemann et al. | 29/576 W |
| 4,549,927 | 10/1985 | Goth et al. | 156/643 |
| 4,631,803 | 12/1986 | Hunter et al. | 437/67 |
| 4,671,851 | 6/1987 | Beyer et al. | 156/645 |
| 4,689,656 | 8/1987 | Silvestri et al. | 357/49 |
| 4,745,081 | 5/1988 | Beyer et al. | 437/38 |
| 4,749,661 | 6/1988 | Bower | 437/33 |

FOREIGN PATENT DOCUMENTS

| | | | |
|---|---|---|---|
| 0116789 | 8/1984 | European Pat. Off. | 437/67 |
| 0098943 | 6/1983 | Japan | 437/67 |
| 0207029 | 9/1986 | Japan | 437/67 |

OTHER PUBLICATIONS

Yamada et al., "A Deep-Trenched Capacitor Technology for 4 Mega Bit Dynamic Ram", IEDM (1985), pp. 702–705.

Primary Examiner—Olik Chaudhuri
Attorney, Agent, or Firm—Rodney M. Anderson; Leo N. Heiting; Melvin Sharp

[57] ABSTRACT

A method of forming trench isolation is disclosed. A trench is etched, either through field oxide or not, into the substrate, using an oxide hard mask. Implant of a channel-stop is then performed through a dummy sidewall oxide, followed by stripping of the dummy oxide and regrowth of the sidewall oxide. A polysilicon layer is deposited into the trench and over the wafer, and is etched to clear from the surface, and overetched so that a recess is formed within the trench. The recess is then filled with a TEOS oxide layer deposited over the wafer surface, and the deposited oxide at the top of the trench is planarized with the surrounding surface.

8 Claims, 5 Drawing Sheets

METHOD FOR FORMING OXIDE-CAPPED TRENCH ISOLATION

This application is related to applications Ser. Nos. 129,271 and Ser. No. 129,261, filed contemporaneously herewith.

This invention is in the field of integrated circuits, and is specifically directed to methods of fabricating bipolar and CMOS transistors in the same integrated circuit.

BACKGROUND OF THE INVENTION

In the integrated circuit field, it is of course beneficial to fabricate as many active devices a given area of semiconductor material as possible, increasing the complexity of the functions capable by individual circuits, as well as increasing the performance of the circuits. This density is not only dependent upon the the size of the active regions (e.g, transistor sizes), but also on the area required to isolate transistors from one another. Prior techniques for the formation of isolation regions between active areas on a semiconductor chip include the well known LOCOS technique, and improvements thereto such as that described in U.S. Pat. No. 4,541,167 assigned to Texas Instrument Incorporated. Such techniques provide isolation by way of providing a transistor which is held in the "off" state, and which has a very high threshold voltage due to the dielectric thickness (field oxide thickness) underlying the gate, and due to channel-stop implants under the field oxide.

In addition, complementary-metal-oxide-semiconductor (CMOS) technology has gained popularity in the fabrication of integrated circuits due to the reduced power consumption and competitive performance of such circuits. CMOS circuits are often formed by p-channel transistors formed in n-type wells or tanks, and n-channel transistors formed in p-type wells or tanks. The wells of opposite conductivity type are often adjacent, requiring isolation therebetween. Junction isolation may be provided by biasing the n-well positive relative to the p-well, reverse-biasing the junction therebetween. Such junction isolation presents parasitic capacitance to the circuit, however, as well as requiring a certain amount of otherwise unusable surface area.

Modern isolation techniques have used trenches etched into the semiconductor substrate. A first example of such trench isolation, incorporated into a bipolar integrated circuit, is described in copending application Ser No. 932,752, filed Nov. 19, 1986 and assigned to Texas Instruments Incorporated. The trench isolation provided in this example uses a polysilicon plug within the trench, to overcome the problems of localized stress from the trench arising due to the dissimilarity of the coefficients of thermal expansion of the substrate (e.g., silicon) to the insulator (e.g., silicon dioxide), as well as the stresses from the formation of a filling oxide. The polysilicon plug filling the trench after formation of the sidewall dielectric serves to minimize the stress, as it minimizes the formation and volume of the oxide within the trench. In this example, however, the layout of the circuit must take into account the possiblity of leakage from an overlying conductive layer into the plug. Since only a relatively thin dielectric is provided over the trench plug, stresses from subsequent process steps such as contact etch, silicidation, and metal deposition and sinter can damage the thin dielectric, especially where a contact via is formed over the trench. An extreme overetch of such a contact via overlying the can thin the dielectric layer to the extent that leakage to the plug can result. For circuits using such trench construction, therefore, overlying contacts are generally prohibited, requiring less efficient circuit layouts.

From a leakage standpoint, it is beneficial therefore to provide a thick dielectric over the top of the polysilicon plug in the trench. An example of such a thicker dielectric over a filled trench is described in copending application Ser. No. 923,454, filed Oct. 27, 1986 and assigned to Texas Instruments Incorporated. In this example, an oxide layer is grown over the trench after it has been filled with a polysilicon plug. While resulting in a thicker oxide over the filled trench, such oxide growth creates significant stress on the trench structure during its growth. This stress results from the growth of oxide at the sidewalls of the trench and at the plug, near the top of the trench. In effect, a wedge of oxide is attempting to grow in the space between the plug and the substrate, such space already containing a sidewall oxide, resulting in similar stress problems as that encountered at the bird's beak of LOCOS isolation.

It is therefore an object of this invention to provide a method for fabricating an integrated circuit using trench isolation which overcomes the above problems.

It is another object of this invention to provide such a method which may be utilized in bipolar, MOS and BiCMOS structures.

It is yet another object of this invention to provide such a method in such a manner that an additional photolithography operation is not required for the additional insulating layer.

Other objects and advantages of the invention will be apparent to those of ordinary skill in the art having reference to the following specification in conjunction with the drawings.

SUMMARY OF THE INVENTION

The invention may be incorporated into a method for fabricating trench isolation in an integrated circuit. A trench is etched at the desired location, channel stop implant at the bottom thereof is made if desired, and a sidewall insulator is provided. The wafer is then covered with a layer of deposited polysilicon, which also fills the trench. The polysilicon is then etched from the wafer surface (stopping on an underlying oxide layer), and is overetched to create a recess in the plug to a predetermined depth. A dielectric layer is then deposited over the wafer, filling the recess in the plug, and is etched back to provide a substantially planar surface.

DETAILED DESCRIPTION OF THE PREFERRED EMBODIMENT

The trench isolation according to the invention will be described herein as incorporated into a BiCMOS structure. It should of course be understood that the trench isolation according to the invention may be incorporated into integrated circuits which are constructed according to MOS, CMOS, or bipolar technologies, still achieving the benefits thereof.

Figure 1:
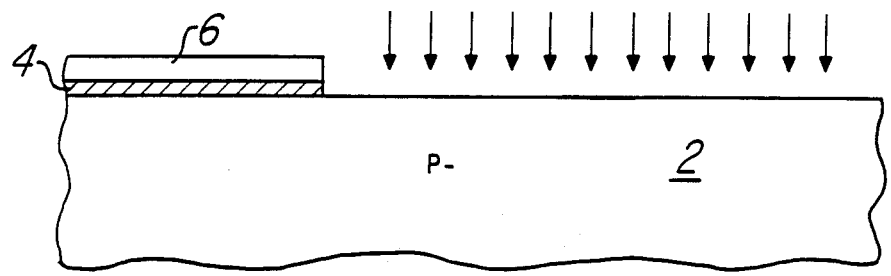
FIGS. 1 through 6 are cross-sectional views of a BiCMOS semiconductor structure in various states of fabrication.

FIG. 1 is a cross-sectional view of a lightly doped p-type single crystal silicon substrate 2 in wafer form, shown prior to the formation of a buried n-type layer. A masking layer consisting of silicon oxide layer 4 covered by silicon nitride layer 6 is formed according to any one of a number of well-known techniques; for example, silicon oxide layer 4 may be a grown oxide having a nominal thickness of 50 nm, and nitride layer 10 may be a deposited by low pressure chemical vapor deposition (LPCVD) to nominally 100 nm thick. Layers 4 and 6 are patterned as shown in FIG. 1, and serve as a mask for the implant of the buried n+ region, such an implant indicated by the arrows of FIG. 1. the photoresist (not shown) used for the patterning of masking layers 4 and 6 is preferably removed prior to the heavy-dose buried n+ ion implantation. An example of an implant for forming the buried n+ region in this embodiment is an antimony implant at an energy on the order of 40 keV with a dose on the order of 5E15 ions/cm$^2$.

After the implant step, the diffusion of the antimony to form buried n+ region 8 occurs during a high temperature anneal, such as at 1250 degrees Celsius for 30 minutes, as is typically required for antimony diffusion. The resultant depth of buried n+ region 8 is in the range of 2 to 3 microns. Of course other dopants such as arsenic may be used to form buried n+ region 8, which may be driven with a lower temperature anneal (e.g., 1000 degrees Celsius for arsenic). Thick oxide region 10 is also formed during this step in the locations not covered by nitride layer 6, to a thickness of between 250 and 300 nm. The masking nitride layer 6 is then stripped after the anneal.

Figure 2:
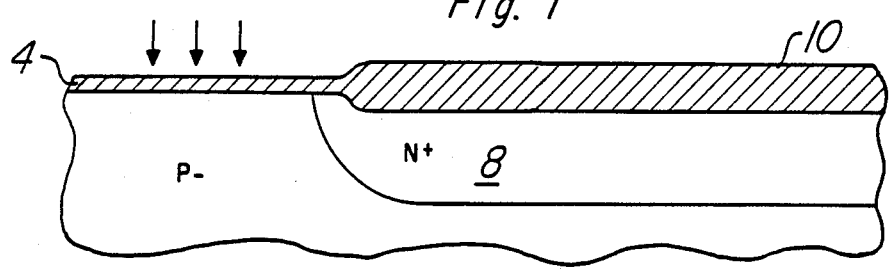

Thick oxide region 10 of FIG. 2 serves as a mask to the ion implant for forming buried p-type regions. Accordingly, a boron implant (ndicated in FIG. 2 by the arrows) is performed, for example at an energy in the range of 40 to 70 keV with a dose in the range of 5E12 to 2E13 ions/cm$^2$. An anneal step is then performed to drive the implanted boron, such as anneal being done at a temperature of 900 to 950 degrees Celsius for a period of from 30 to 60 minutes, depending upon the depth desired; in this embodiment, the depth of buried p region 12 is approximately 1 micron. It should be noted that the provision of buried p-regions by this implant is not essential in fabricating an operable device, as a p-type substrate 2 of sufficient doping concentration to prevent punch-through between adjacent buried n+ regions 8 could alternatively be used, without the need for a buried p-type region. Omission of the buried p-type regions also would allow the use of a thick oxide layer as the n+ implant mask, rather than the nitride/oxide sandwich of layers 4 and 6 described above.

In addition, it should be noted that the use of thick oxide layer 10 to mask the boron implant results in a buried p-type region which is adjacent to and self-aligned with buried n+ region 8, without requiring another mask and pattern step. Of course, such an additional mask and pattern step prior to the boron implant may alternatively be used if a space between the eventual p-type buried region and buried n+ region 8 is desired.

Figure 3:
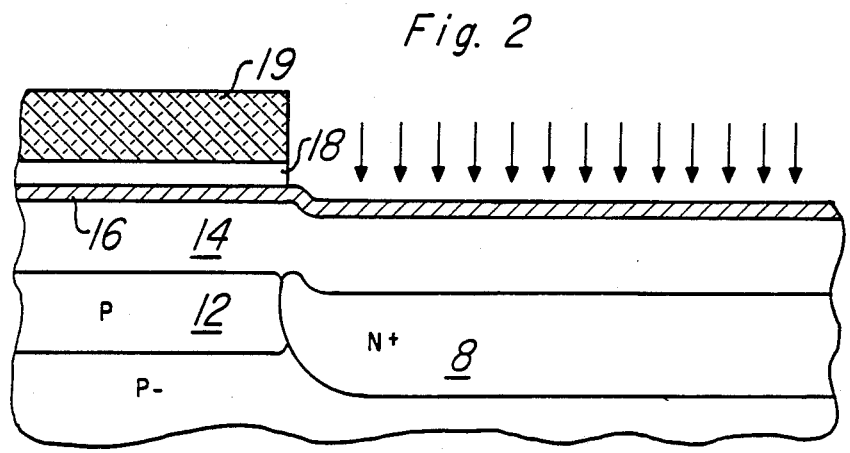

FIG. 3 illustrates buried p-type region 12 formed adjacent to buried n+ region 8. Subsequent to the boron implant described above, thick oxide layer 10 (as well as oxide 4) is stripped, and epitaxial layer 14 is grown according to well known techniques. Epitaxial layer 14 is this embodiment of the invention is very lightly doped n-type material (i.e., greater than 10 ohm-cm), so as to be substantially intrinsic silicon. As will be described below, epitaxial layer 14 will be selectively implanted to form p-type and n-type wells into which both the MOS and bipolar transistors will be formed. For the benefit of the bipolar transistors, epitaxial layer 14 is kept relatively thin (for example, on the order of 0.75 to 1.50 microns) so that the length of the portion of the collector which is in the n-well (between a diffused base region and buried n+ region 8) is minimized, reducing the collector resistance.

A thin layer (e.g., 35 nm) of oxide 16 is grown on the surface of epitaxial layer 14, followed by LPCVD nitride layer 18 of an approximate thickness of 100 nm deposited thereupon. Nitride layer 18 is then patterned by photoresist layer 19 as shown in FIG. 3, to serve as a mask for the n-well implant (shown by the arrows of FIG. 3), in a manner similar to nitride layer 6 described above. Oxide 16 may remain as a passivation layer over the regions into which the implant will occur, since the energy of the n-well implant is high enough to place the dopant into epitaxial layer 14 through oxide 16.

Figure 4:
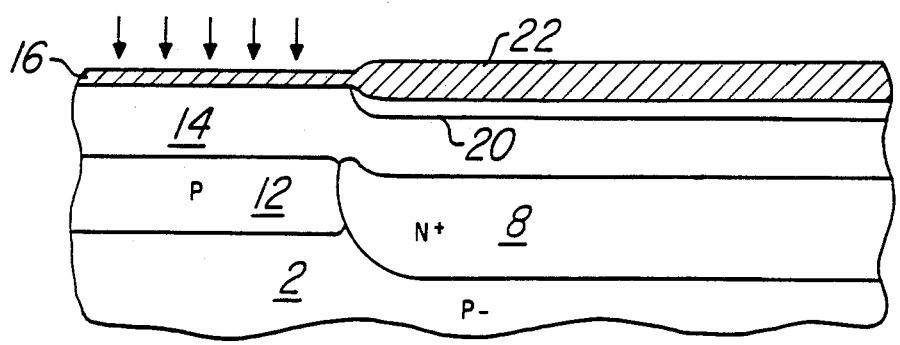

The ion implantation for forming the n-wells in epitaxial layer 14 may be done by a single ion implant operation, or by multiple implants, depending upon the dopant profile desired in the n-well. In this embodiment of the invention, a dual n-well implant is then performed using a low energy phosphorous implant followed a high-energy phosphorous implant. For example, the first implant may be a dose of 1E12 ions/cm$^2$ at 70 keV, and the second implant may be done at 350 keV with a dose on the order of 1.2E12 ions/cm$^2$. Of course, the n-well implant or implants may be significantly altered from that described herein, depending upon the desired dopant profile. The dual implant is followed by an oxide growth step, performed in a steam atmosphere at 900 degrees Celsius for 30 minutes, resulting in oxide layer 22 having a thickness on the order of 350 nm, covering the regions receiving the n-well implant. Nitride oxidation mask layer 18 is then stripped, and the p-well is implanted, masked by oxide regions 22 overlying the n-well regions 20. The p-well implant is a boron implant, for example having a does of 1E12 ions/cm$^2$ at 50 keV, and is indicated by the arrows in FIG. 4.

Following the p-well implant, both the n-well and p-well implants are driven to the desired depth. For example, a 150 minute drive in a $N_2/O_2$ environment at 1000 degrees Celsius will typically result in a well depth of approximately 1 micron, for the implant dose and energies described hereinabove. As discussed above, prior BiCMOS fabrication methods utilized n-type epitaxy (for example, on the order of 1 ohm-cm or less), allowing for either omission or dose reduction of the n-well implant. For example, an n-well can be formed into an 0.5 ohm-cm epitaxial layer by way of a single low energy phosphorous implant, in order to minimize the potential of implant damage in the n-well regions (which will eventually contain n-p-n bipolar transistors). However, formation of the p-well in such an epitaxial layer requires counterdoping of the n-type epitaxial layer into p-type. As is well known in the art, this counterdoping degrades the carrier mobility of the resulting layer; since the p-well will be used in the channel region of the n-channel MOS transistors, the performance of the n-channel MOS transistors is accordingly degraded by such counterdoping. As is well known, n-channel transistors in a CMOS device generally have faster switching times than the p-channel transistors, due to the greater carrier mobility in the channel region; CMOS designs thus generally use n-channel MOS transistors as much as possible in speed-critical functions. Accordingly, degradation of carrier mobility in the channel region of the n-channel transistors in a CMOS or BiCMOS circuit will directly impact the performance of the circuit. The use of the intrinsic epitaxial layer 14 according to this embodiment of the invention reduces the mobility degradation in p-well 24 by minimizing the counterdoping required in its formation. Formation of n-well 20 in intrinsic epitaxial layer 14 according to the above-described method has not resulted in noticable implant damage or degradation of the bipolar transistors.

Figure 5:
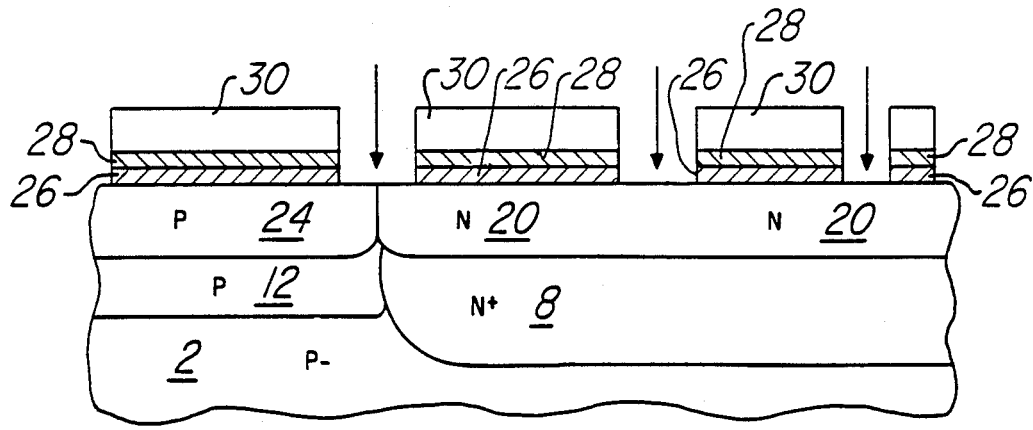

Oxide regions 22 and such oxide as is formed in the drive step are then stripped, leaving the n-well region 20 and p-well region 24 as shown in FIG. 5. As in the case of the formation of the buried p-type regions 12, p-well region 24 is formed self-aligned within-well region 20.

This embodiment further includes additional isolation regions between the p-well region 24 and n-well region 20. Accordingly, after the oxide regions 22 are etched, a 10 nm layer 26 of silicon dioxide is grown, upon which is deposited a buffer polysilicon layer 28, having a thickness of approximately 50 nm. LPCVD nitride layer 30 is then deposited upon polysilicon 28, and the nitride/polysilicon/oxide sandwich is then patterned to expose the isolation regions. The benefits of polysilicon layer 28 as a buffer in the formation of LOCOS isolation are described in U.S. Pat. No. 4,541,167, issued Sept. 17, 1985 and assigned to Texas Instruments Incorporated. After exposure of the isolation regions, a channel-step is implanted to supplement the p-well boron concentration in p-wells 24 near the surface. This supplementation overcomes the segregation of boron from p-wells 24 into the isolation oxide regions during formation (such formation described below). An example of such an implant is a boron implant of a dose in the range of 3E12 to 5E12 ions/cm$^2$, at an energy on the order of 40 keV. However, it should be noted that portions of n-wells 20 also receive this implant (unless a separate masking step is performed), requiring optimization of the channel-stop implant dose to adequately compensate the boron segregation from p-wells 24 (i.e., to keep the field oxide threshold voltage high in p-wells 24) while avoiding overcompensating the portions of n-wells 20 receiving the implant (i.e., to keep the field oxide threshold voltage high in n-wells 20). A high pressure oxidation step (e.g., 52 minutes in a steam environment at 10 atmospheres pressure and 900 degrees Celsius) is then performed to form the recessed isolation oxide layers 32, such oxidation masked by nitride layer 30 over the active regions of the structure. It should of course be noted that any one of a number of known techniques for forming field oxide layers may be used to form oxide layers 32 (for example, more or less recess may be desirable, the poly buffering may be omitted, or formation of the oxide may occur at a different temperature or at atmosphereic pressure); the method described in said U.S. Pat. No. 4,541,167 is preferable, for the reasons described therein.

Figure 6:
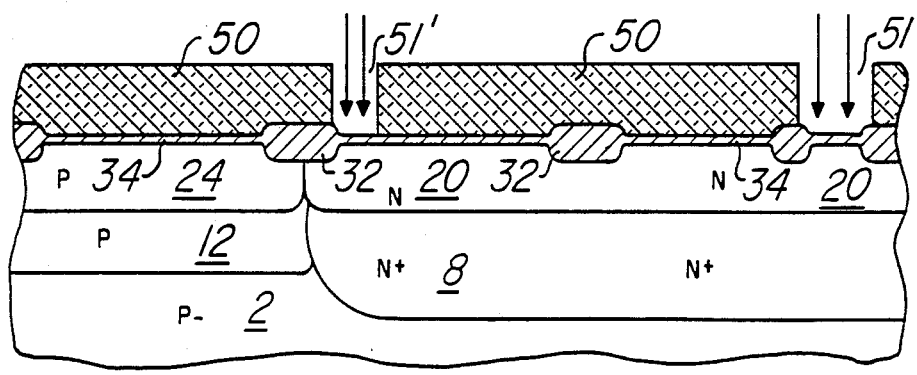

Referring now to FIG. 6, the resultant recessed isolation oxide regions 32 are illustrated. The thickness of oxide regions 32 formed by the above process is preferably at least 700 nm. Nitride layer 30, buffer polysilicon layer 28, and oxide layer 26 are etched according to conventional techniques, clearing the surface of the wafer. A thin pregate oxide, or dummy gate oxide, layer 34 is then grown to a thickness of the order of 20 nm for protection of the silicon surface during subsequent process steps leading up to the formation of the actual gate dielectric.

Figure 7A:
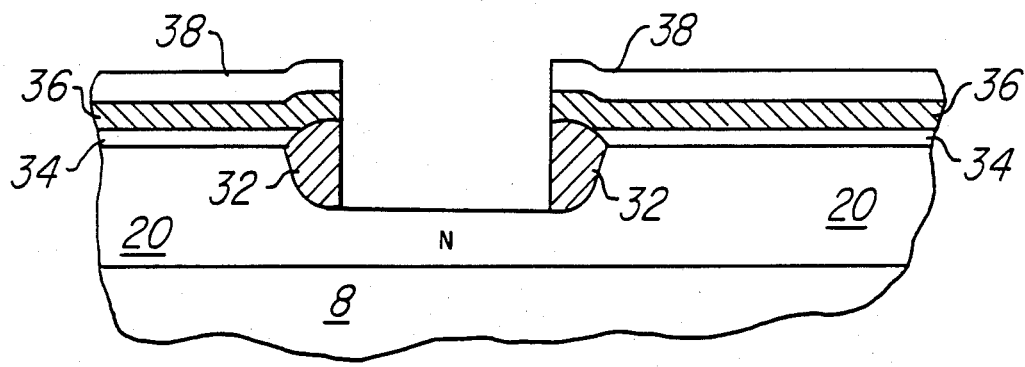
FIGS. 7a through 7e are cross-sectional views of a BiCMOS semiconductor structure illustrating various states of the fabrication of trench isolation according to the invention, into the structure of FIG. 6.

In operation, p-wells 24 and n-wells 20 will be biased so that the junctions therebetween will be reverse-biased, serving to isolate the wells from one another. Accordingly, a portion of a p-well 24 may be disposed between tow n-wells 20 for isolating the two n-wells 20 from one another; an example of the need for such isolation is for isolating an n-well 24 which will contain MOS transistors from an n-well 24 which will contain bipolar transistors. An alternative to such junction isolation between wells is the use of trench isolation. FIGS. 7a through 7e illustrate the formation of such trench isolation into the structure of FIG. 6, used in the example of isolating two portions of n-well 20 from one another. Such trench isolation is preferable over junction isolation in certain situations, for example, where the additional process cost to form the trenches is outweighed by the added performance from reduced sidewall capacitance (of the trench versus the reverse-biased junctions), or by the savings of wafer surface area of the trench scheme due to tighter packing density allowed by trench isolation. Referring to FIG. 6a, after the growth of oxide layer 34 a buffer layer of polysilicon 36 is deposited by LPCVD to a thickness on the order of 250 nm. A layer of TEOS oxide 38, having a thickness on the order of 1 micron, is then deposited on top of the buffer polysilicon layer 36 to serve as hard mask material for the etch of the trench. Photoresist (not shown) is then used to define the pattern for the trench, after which TEOS oxide 38, polysilicon layer 36, oxide layer 34 and field oxide 32 are etched to expose a portion of n-well 20 through which the isolating trench is to be formed. FIG. 7a shows the result of the formation of the hard trench mask.

Figure 7B:
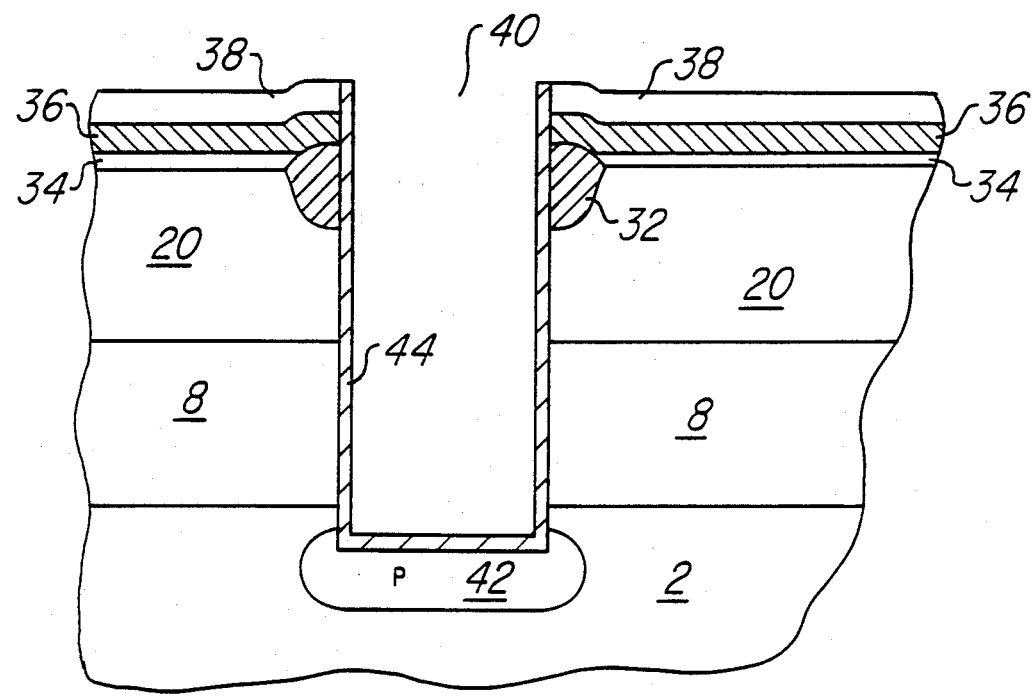

Following the formation of the hard mask, a trench 40 is etched through recessed oxide layer 32 and through n-well 20 by way of reactive ion etch (RIE), according to well known trench etch techniques. The trench is preferably extended beyond the depth of buried n+ region 8 to a depth reaching substrate 2. A first sidewall layer of oxide (not shown) is grown in trench 40, to a thickness of approximately 100 nm, serving in a role similar to a dummy gate oxide. A channel step implant is performed into the bottom of the trench 40, through the first sidewall oxide, to form channel-stop region 42 thereat. The first sidewall oxide layer is then stripped, and a 100 nm layer 44 of oxide is regrown on the sidewalls and bottom of trench 40, as shown in FIG. 7b.

Figure 7C:
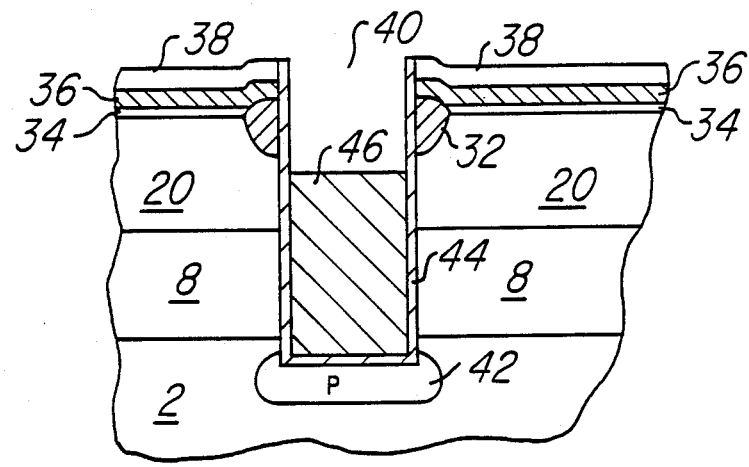
Figure 7D:
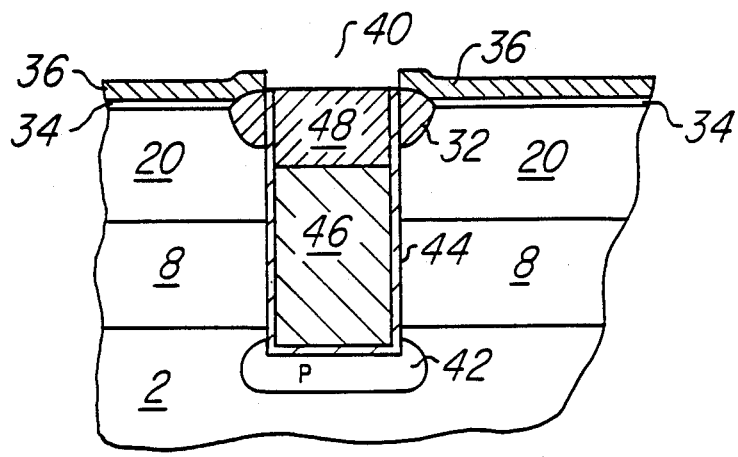

After regrowth of the sidewall oxide layer 44, trench 40 is filled with a polysilicon plug 46, formed by CVD of a polysilicon layer over the entirety of the wafer. A planarization etch of the polysilicon layer is performed until TEOS oxide layer 38 is reached, stopping the etch at the surface of the wafer; the etch is continued so that the polysilicon plug 46 inside trench 40 is recessed to a predetermined depth (e.g., in a range of 0.5 to 1.0 microns), as shown in FIG. 7c.

The formation of the trench isolation is completed by deposition of a second TEOS oxide layer 48 over the entirety of the wafer, filling the recess in trench 40 caused by the overetch of polysilicon plug 46. TEOS oxide layer 48 is then etched back until polysilicon layer 36 is reached at the surface of the wafer away from trench 40, so that TEOS oxide 48 is planarized with the top of recessed oxide layer 34 near the trench, providing the structure of FIG. 7d.

Figure 7E:
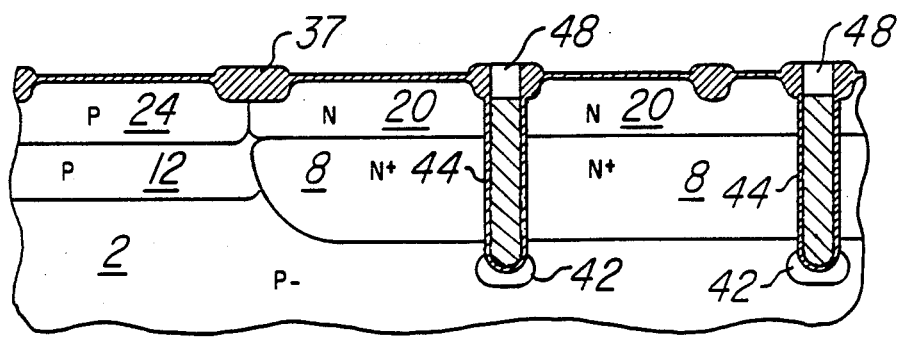
Figure 8:
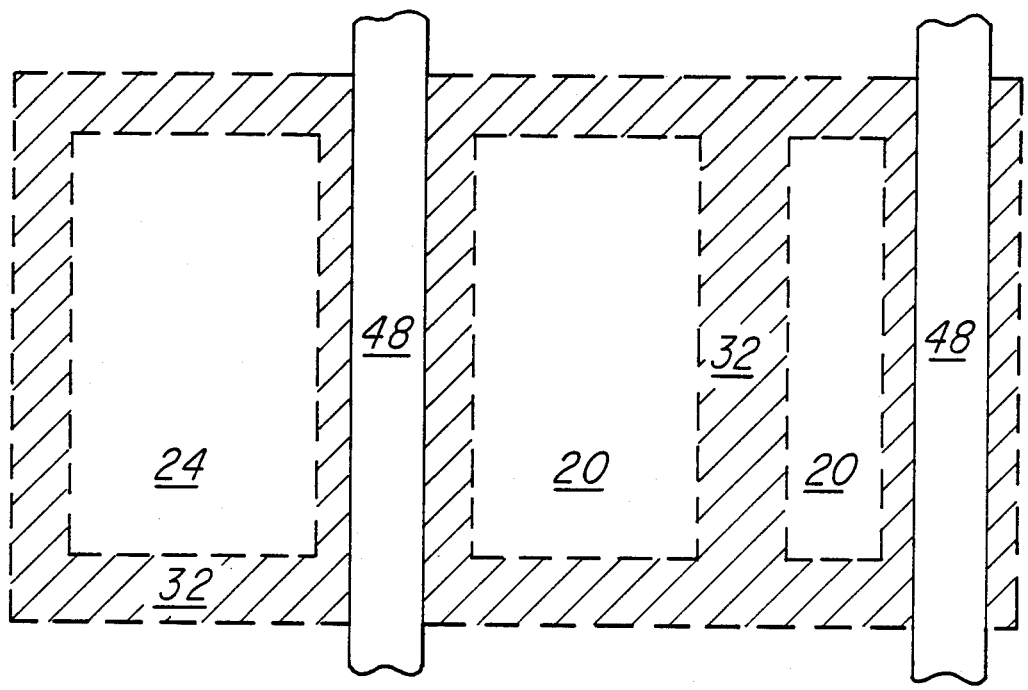
FIG. 8 is a plan view of the structure of FIG. 7e.

The filling of trench 40 with a polysilicon plug 46 provides a structure which adds minimal stress to the integrated circuit, since polysilicon and single crystal silicon expand and contract at substantially the same rate during temperature cycling. It should be noted that the trench structure resulting from the method described above relative to FIGS. 7a through 7d allows for subsequent metal-to-metal or metal-to-poly contacts to be made directly above trench 40, because the thick oxide within the recess of trench 40 minimizes the risk of overetching the contact via into polysilicon plug 46 and causing leakage thereinto from the overlying layer. Such a structure thus removes the requirement that contacts be spaced away from the top of trench 40, such a requirement often resulting in additional wafer area merely for contact spacing rules to be obeyed. It should further be noted that prior techniques used to oxidize the top of the trench without recessing the polysilicon plug 46 resulted in bird's-beak formation near the surface of the structure, adding stress-induced leakage potential at the silicon-silicon oxide interface at the top of trench 40. The formation of the TEOS oxide cap 48 of FIG. 7d thus provides for a low stress fill of the trench, so that contacts may be made directly thereabove with minimal stress-induced leakage occuring at or near the top of trench 40. FIGS. 7e and 8 illustrate, in cross-section and plan view, respectively, such trench isolation as incorporated into the structure of FIG. 6.

It should be noted that the trench isolation method described hereinabove relative to FIGS. 7a through 7e is also useful in the fabrications of totally bipolar integrated circuits, for the same reasons as described above. In such an application, field oxide regions 32 would not normally be present, so that the etching of trenches 40 would require the formation of only the hard mask provided by oxide layer 38.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such changes and additional embodiments will of course include variations on the implant conditions, oxidation and diffusion cycles, and metallization systems described herein. It is contemplated that all such changes and additional embodiments are within the spirit and true scope of the invention as claimed below.

I claim:

1. A method for forming an isolation region for an integrated circuit at a surface of a semiconductor body, comprising:
    etching a trench into said semiconductor body at a selected location of said surface;
    forming a dummy dielectric layer over the sides of said trench;
    implanting the bottom of said trench with an impurity to form a channel stop;
    removing the dummy dielectric layer from the sides of said trench after said implanting step;
    forming a first dielectric layer over the sides of said trench, after said step of removing said dummy dielectric layer;
    forming a plug in said trench over said first dielectric layer, the top of said plug being below the top of said trench;
    forming a second dielectric layer over the top of said plug to substantially fill said trench.

2. The method of claim 1, wherein said step of forming said plug comprises:
    depositing a layer of semiconductor material over said surface of said semiconductor body, said semiconductor layer filling said trench;
    etching said semiconductor layer in such a manner that the semiconductor layer is recessed into said trench.

3. The method of claim 2, wherein said etching step clears the semiconductor layer from said surface of said semiconductor body.

4. The method of claim 3, wherein said semiconductor layer comprises polycrystalline silicon.

5. The method of claim 2, wherein said step of forming said second dielectric layer comprises:
    depositing an oxide layer over said surface of said semiconductor body, said oxide layer filling the portion of said trench from which the semiconductor layer is recessed; and
    etching said oxide layer so that the top of said trench is substantially coplanar with the surface of said semiconductor body surrounding said trench.

6. The method of claim 1, further comprising:
    forming a buffer layer of polycrystalline silicon over said substrate;
    forming a hard mask layer over said layer of polycrystalline silicon;
    forming a photoresist pattern over said hard mask layer to define the location at which said isolation structure is to be formed.

7. The method of claim 6, further comprising:
    prior to said step of etching said trench, forming a field oxide layer over selected portions of said surface;
    and wherein said step of etching a trench comprises:
    etching said hard mask layer, said buffer layer and said field oxide structure to expose a location of said surface lying thereunder; and
    etching the portions of said surface which are not covered by said hard mask layer or said field oxide.

8. The method of claim 7, wherein said hard mask layer comprises silicon dioxide.

* * * * *